United States Patent
Chrysler et al.

(10) Patent No.: US 6,921,706 B2
(45) Date of Patent: Jul. 26, 2005

(54) ELECTRONIC ASSEMBLY INCLUDING A DIE HAVING AN INTEGRATED CIRCUIT AND A LAYER OF DIAMOND TO TRANSFER HEAT

(75) Inventors: Gregory M. Chrysler, Chandler, AZ (US); Abhay A. Watwe, Chandler, AZ (US); Sairam Agraharam, Phoenix, AZ (US); Kramadhati V. Ravi, Atherton, CA (US); Michael C. Garner, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/773,879

(22) Filed: Feb. 6, 2004

(65) Prior Publication Data

US 2004/0157386 A1 Aug. 12, 2004

Related U.S. Application Data

(62) Division of application No. 09/920,275, filed on Jul. 31, 2001, now Pat. No. 6,770,966.

(51) Int. Cl.[7] .......................... H01L 21/46; H01L 21/78; H01L 21/301
(52) U.S. Cl. ........................................ 438/460; 438/113
(58) Field of Search ............................ 438/460, 33, 68, 438/106, 113, 462, 464, 474, 475, 473, 680, 931

(56) References Cited

U.S. PATENT DOCUMENTS

| | | | | |
|---|---|---|---|---|
| 5,131,963 A | * | 7/1992 | Ravi | 148/33.3 |
| 5,272,104 A | | 12/1993 | Schrantz et al. | |
| 5,650,639 A | * | 7/1997 | Schrantz et al. | 257/77 |
| 5,696,665 A | * | 12/1997 | Nagy | 361/723 |
| 5,904,546 A | * | 5/1999 | Wood et al. | 438/460 |
| 6,051,063 A | * | 4/2000 | Tanabe et al. | 117/89 |
| 6,211,041 B1 | * | 4/2001 | Ogura | 438/458 |
| 6,337,513 B1 | * | 1/2002 | Clevenger et al. | 257/706 |
| 6,337,516 B1 | * | 1/2002 | Jones et al. | 257/752 |
| 2004/0029359 A1 | | 2/2004 | Letertre et al. | |

FOREIGN PATENT DOCUMENTS

| | | |
|---|---|---|
| EP | 0 814 509 A2 | 12/1997 |
| WO | WO 94/15359 | 7/1994 |

OTHER PUBLICATIONS

Liu et al., "Diamond Chemical Vapor Deposition: Nucleation and Early Growth Stages", 1995, pp. 1–7.*
Wolf, Stanley et al. Silicon Processing for the VLSI Era—vol. 1, 1986, pp. 1–8.*

* cited by examiner

Primary Examiner—David Nhu
(74) Attorney, Agent, or Firm—Blakely, Sokoloff, Taylor & Zafman LLP

(57) ABSTRACT

Processes are described whereby a wafer is manufactured, a die from the wafer, and an electronic assembly including the die. The die has a diamond layer which primarily serves to spread heat from hot spots of an integrated circuit in the die.

6 Claims, 7 Drawing Sheets

FLIP

GRIND

ETCH AND POLISH

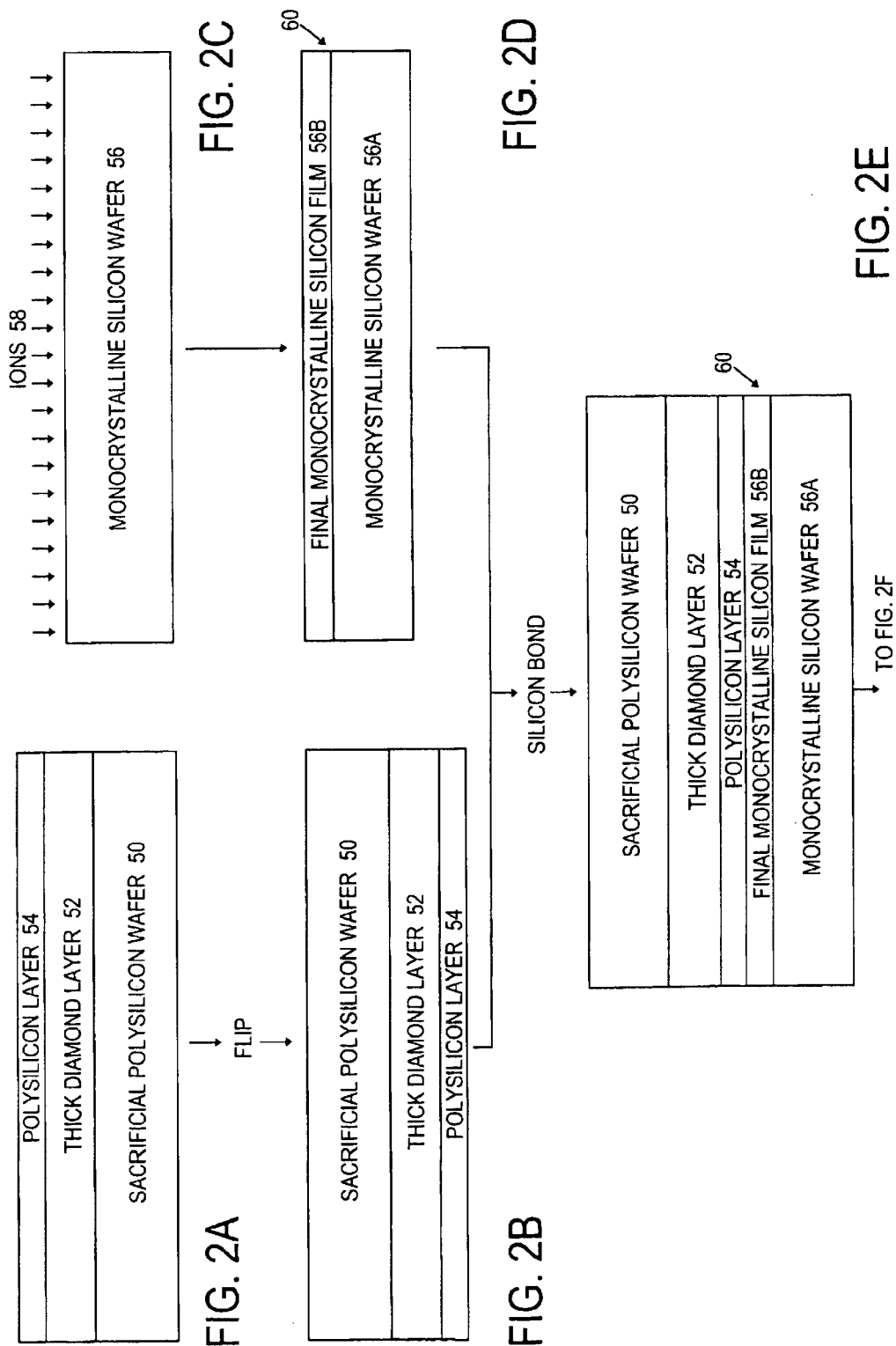

FROM 2E
↓
ETCH
↓

↓
FLIP
↓

↓
SHEAR
↓

↓
ETCH AND POLISH

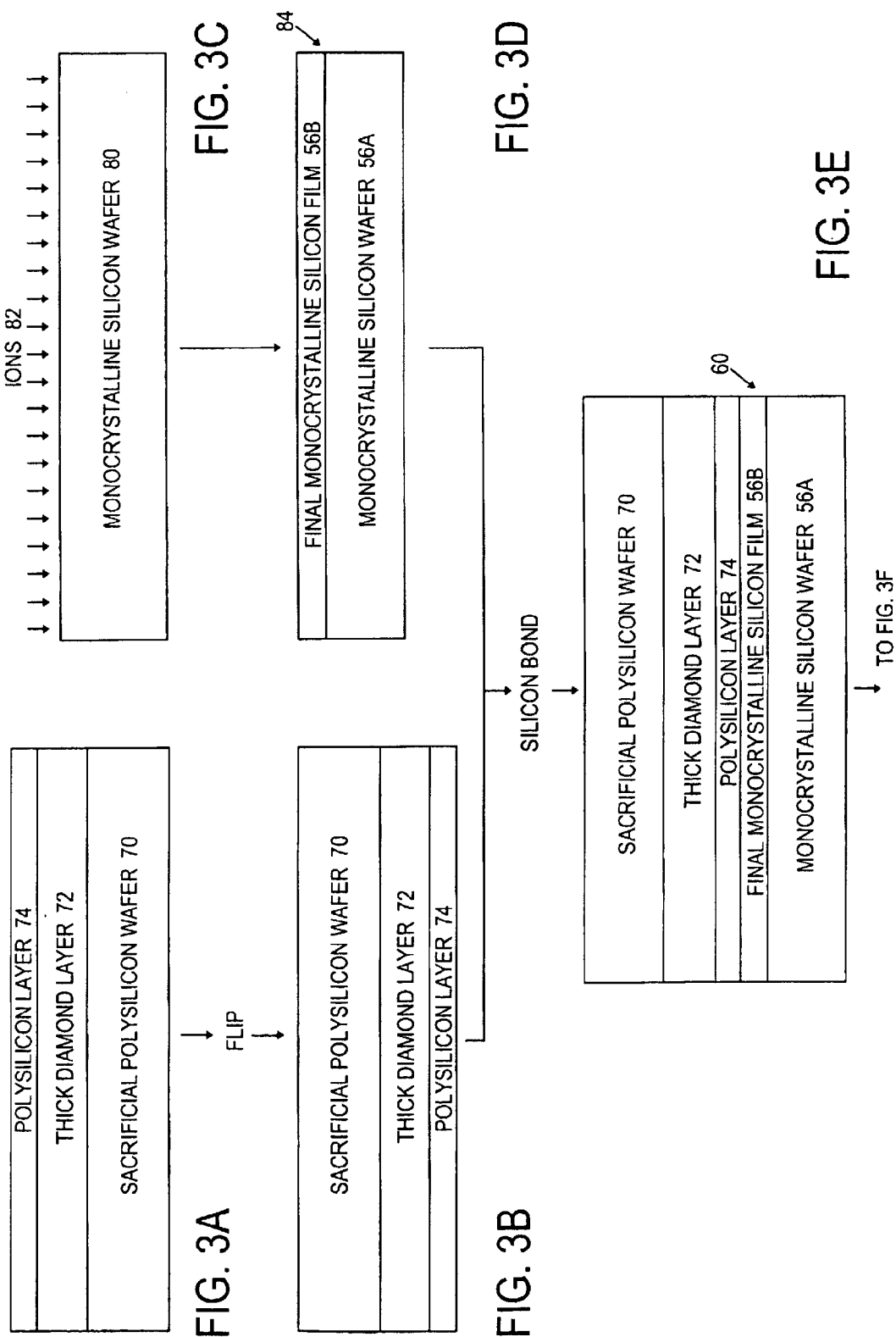

FIG. 3F
FIG. 3G
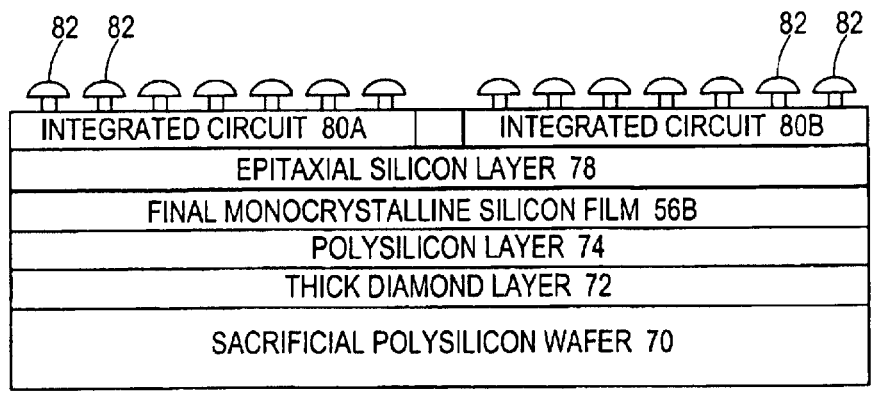
FIG. 3H

ELECTRONIC ASSEMBLY INCLUDING A DIE HAVING AN INTEGRATED CIRCUIT AND A LAYER OF DIAMOND TO TRANSFER HEAT

CROSS-REFERENCE TO OTHER APPLICATIONS

This Application is a divisional of prior U.S. patent application Ser. No. 09/920,275, filed on Jul. 31, 2001, now U.S. Pat. No. 6,770,966.

BACKGROUND OF THE INVENTION

1). Field of the Invention

This invention relates to a method of manufacturing a combination wafer, dice from the wafer, and an electronic assembly including such a die, wherein the die has a layer of diamond for purposes of conducting heat.

2). Discussion of Related Art

Integrated circuits are usually formed on silicon wafers which are subsequently sawed into individual dice. Each die then has a portion of the silicon wafer with a respective integrated circuit formed thereon. Electronic signals can be provided to and from the integrated circuit. Operation of the integrated circuit causes heating thereof and an increase of temperature of the integrated circuit may cause its destruction. The temperature of all points on the integrated circuit should thus be maintained below a certain maximum temperature. Operation of the integrated circuit is not uniform so that certain points on the integrated circuit generate more heat than others, thus creating "hot spots". Without the hot spots, it may be possible to increase the average power dissipation of the die while maintaining a desired temperature of the integrated circuit, thus allowing it to operate at a higher frequency.

BRIEF DESCRIPTION OF THE DRAWINGS

The invention is further described by way of examples wherein:

FIG. 2a is a cross-sectional side view of a sacrificial polysilicon wafer having a thick diamond layer and a polysilicon layer formed thereon;

FIG. 2b is a view similar to FIG. 2a with the polysilicon layer at the bottom;

FIG. 2c is a cross-sectional side view of a monocrystalline silicon wafer having ions implanted into an upper surface thereof;

FIG. 2d is a view similar to FIG. 2c showing a boundary which is formed due to the ions being implanted;

FIG. 2e is a cross-sectional side view of a combination wafer constructed by silicon bonding the polysilicon layer to the final monocrystalline silicon film;

FIG. 3a is a cross-sectional side view of a sacrificial polysilicon wafer having a thin diamond layer and a polysilicon layer formed thereon;

FIG. 3b is a view similar to FIG. 3a with the polysilicon layer at the bottom;

FIG. 3c is a cross-sectional side view of a monocrystalline silicon wafer having ions implanted into an upper surface thereof;

FIG. 3d is a view similar to FIG. 3c showing a boundary which is formed due to the ions being implanted;

FIG. 3e is a cross-sectional side view of a combination wafer which is formed by silicon bonding the polysilicon layer to a final monocrystalline silicon film of the monocrystalline silicon wafer;

FIG. 3f is a view similar to FIG. 3e with the monocrystalline silicon wafer at the top;

FIG. 3g is a view similar to FIG. 3f after a shearing operation;

FIG. 3h is a view similar to FIG. 3g after the formation of an epitaxial silicon layer, the manufacture of integrated circuits and the formation of contacts;

DETAILED DESCRIPTION OF THE INVENTION

First, second, and third processes are described respectively with respect to FIGS. 1a–g, FIGS. 2a–h, and FIGS. 3a–j whereby, in each case, a wafer is manufactured, a die from the wafer, and an electronic assembly including the die. The die has a diamond layer which primarily serves to spread heat from hot spots of an integrated circuit in the die.

In the first process, a relatively thick layer is formed which spreads more heat. The first process however utilizes a relatively cumbersome grinding operation. Because the diamond layer is relatively thick, a specialized laser cutting operation is utilized for cutting through the diamond layer.

In the second process, the grinding operation of the first process is eliminated and a shearing operation is utilized instead. A thick diamond layer is also formed in the second process, with associated advantages and disadvantages.

In the third process a shearing operation is also used to eliminate a grinding operation, but a thin diamond layer is formed which is easier to cut with a conventional saw. The thin diamond layer is also covered by a sacrificial polysilicon wafer so that a combined wafer is formed having silicon upper and lower surfaces. Such a combined wafer may be more "transparently" used in conventional machinery for processing conventional silicon wafers. The sacrificial polysilicon wafer also provides the structural support lacking in the thin diamond layer.

Utilizing a Grinding Operation in the Production of a Thick Diamond Layer

Figure 1A:
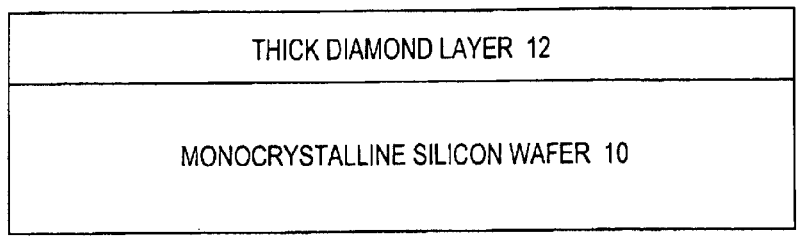
FIG. 1a is a cross-sectional side view of a monocrystalline silicon wafer having a thick diamond layer formed thereon.

FIG. 1a of the accompanying drawings illustrates a monocrystalline (single crystal) silicon wafer 10 on which a thick diamond layer 12 is deposited. Monocrystalline silicon wafers are manufactured according to a known process. A long thin vertical core of monocrystalline silicon (a semiconductor material) is inserted vertically downwardly into a bath of silicon. The core is then drawn vertically upwardly out of the bath. Monocrystalline silicon deposits on the core while it is drawn out of the bath so that a monocrystalline silicon ingot is formed having a diameter much larger than a diameter of the core. Presently, such an ingot has a diameter of approximately 300 mm and a height which is a multiple of the diameter. The ingot is then sawed into many wafers. Presently, a wafer sawed from an ingot has a thickness of approximately 750 microns. The monocrystalline silicon wafer 10 thus has a diameter of approximately 300 mm and a thickness of approximately 750 microns.

The thick diamond layer 12 is deposited utilizing chemical vapor diamond deposition (CVDD) technology. The monocrystalline silicon wafer 10 is located in the CVDD chamber and heated to a relatively high temperature of for example approximately 1000° C. Gases are then introduced into the chamber which react with one another to form diamond. The diamond then deposits out of the gases onto an entire upper surface of the monocrystalline silicon wafer 10. The diamond that deposits on the monocrystalline silicon wafer 10 is solid multicrystalline diamond having a thermal conductivity of approximately 1000 W/mK and is attached to an upper surface of the monocrystalline silicon wafer 10. The process is continued until the thick diamond layer 12 has a thickness of between 300 microns and 500 microns. The resulting thick diamond layer 12 thus has a diameter of 300 mm. The combination wafer of FIG. 1a is then removed from the CVDD chamber and allowed to cool. Further aspects of deposition of multicrystalline diamond are known in the art and are not further elaborated on herein.

Figure 1B:
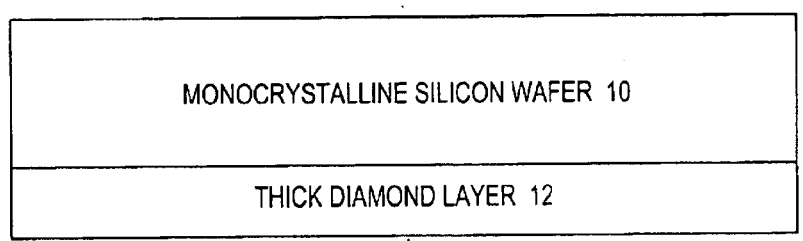
FIG. 1b is a view similar to FIG. 1a with the monocrystalline silicon wafer at the top.

As shown in FIG. 1b, the combination wafer of FIG. 1a is then flipped so that the monocrystalline silicon wafer 10 is at the top. The thick diamond layer 12 is then located on a surface of a grinding machine. A grinding head of the grinding machine then grinds the monocrystalline silicon wafer 10 down.

Figure 1C:
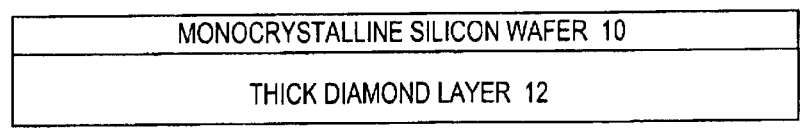
FIG. 1c is a view similar to FIG. 1b after grinding the monocrystalline silicon wafer down.

FIG. 1c illustrates the combination wafer after the monocrystalline silicon wafer 10 is ground down. The monocrystalline silicon wafer 10 typically has a thickness of between 10 and 25 microns. The combination wafer shown in FIG. 1c is then removed from the grinding machine. Because the thick diamond layer 12 has a thickness of between 300 and 500 microns, the combination wafer does not break when removed from the grinding machine and subsequently handled. The thick diamond layer 12 thus provides the structural support for the relatively thin monocrystalline silicon wafer 10. The upper surface of the monocrystalline silicon wafer 10 is subsequently etched and polished to obtain a desired finish. Stresses due to the grinding operation are also removed.

Figure 1D:
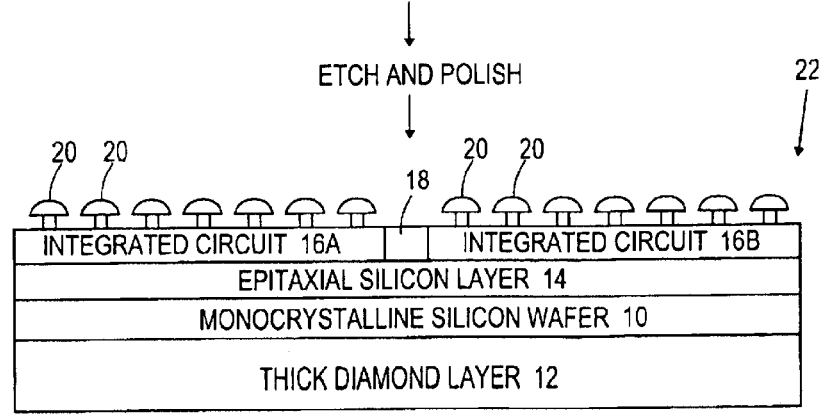
FIG. 1d is a view similar to FIG. 1c after an epitaxial silicon layer, integrated circuits, and contacts are formed on the monocrystalline silicon wafer.

FIG. 1d illustrates subsequent fabrication that is carried out on the monocrystalline silicon wafer 10. First, and epitaxial silicon layer 14 is grown on the monocrystalline silicon wafer 10. The epitaxial silicon layer 14 follows the crystal structure of the monocrystalline silicon wafer 10 and is thus also monocrystalline. A primary difference between the epitaxial silicon layer 14 and the monocrystalline silicon wafer 10 is that the expitaxial silicon layer 14 includes dopants. As such, the epitaxial silicon layer 14 is either n-doped or p-doped.

Next, integrated circuits 16A and 16B are formed. An integrated circuit 16A or 16B includes a plurality of semiconductor electronic components such as transistors, capacitors, diodes, etc., and upper lever metalization which connect the electronic components. A transistor has source and drain regions that are implanted into the epitaxial silicon layer 14. These source and drain regions have opposite doping than the bulk of the epitaxial silicon layer 14. The source and drain regions are implanted to a required depth into the epitaxial silicon layer 14 but usually not all the way through the epitaxial silicon layer 14 so that some of the unimplanted epitaxial silicon remains below the respective source or drain region. The metalization includes metal lines which are all located above the epitaxial silicon layer 14. Contact pads are then formed on the integrated circuits 16A and 16B. The integrated circuits 16A and 16B are identical to one another and are separated from one another by a small scribe street 18. Bumps 20 are then formed on the contact pads on the integrated circuits 16A and 16B. Although not shown, the bumps 20 are in an array and rows and columns on a respective integrated circuit 16A and 16B.

Figure 1E:
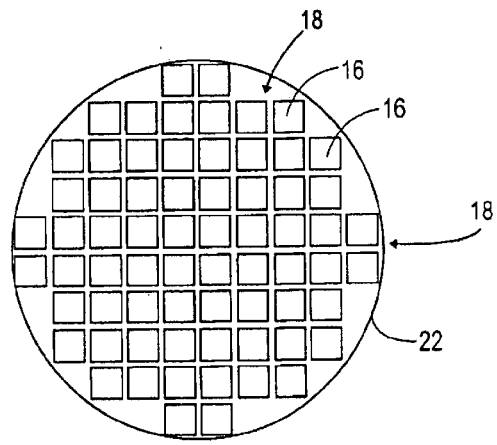
FIG. 1e is a top plan view of the structure shown in FIG. 1d, specifically indicating locations of integrated circuits and scribe streets between them.

FIG. 1e illustrates the combination wafer of FIG. 1d from above. The combination wafer has an outer edge 22 having a diameter of approximately 300 mm. Many of the integrated circuits 16 are formed in rows and columns within the edge 22. Each integrated circuit 16 has a rectangular outline. A respective scribe street is located between a respective row or column.

The combination wafer of FIG. 1e is then laser cut through the scribe streets 18 into a plurality of dice. Each die thereby includes only one of the integrated circuits 16. Cutting of a wafer is also referred to as "singulation" or "dicing". The thick diamond layer 12 is extremely hard and because of its thickness, it may be difficult to cut the thick diamond layer 12 utilizing a conventional sawing operation, hence the reason for the more sophisticated laser cut.

Figure 1F:
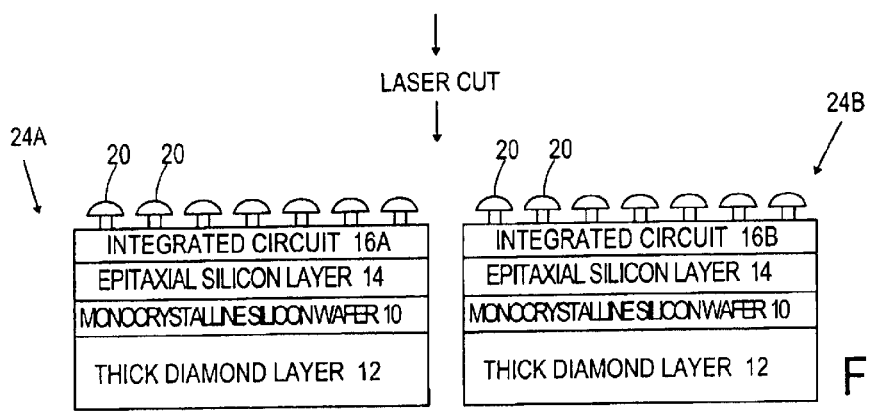
FIG. 1f is a view similar to FIG. 1e after a laser cut to produce singulated dice.

FIG. 1f illustrates two dice 24A and 24B. Each die 24A and 24B includes a respective portion of the thick diamond layer 12, the monocrystalline silicon wafer 10, and the epitaxial silicon layer 14. The die 24A includes the integrated circuit 16A and the die 24B includes the integrated circuit 16B. Each die 24A and 24B includes a respective set of the bumps 20.

Figure 1G:
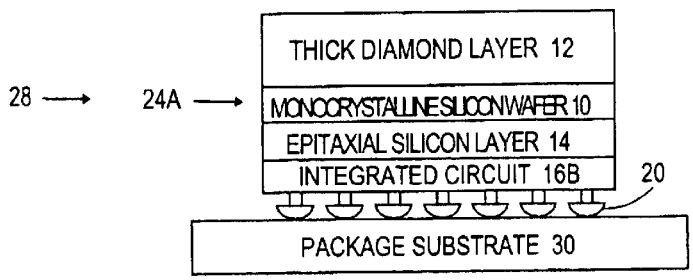
FIG. 1g is a cross-sectional side view of an electronic package having one of the dice which is flipped and located on a package substrate.

FIG. 1g illustrates and electronic assembly including a package substrate 30 and the die 24A. The die 24A is flipped relative to its position in FIG. 1f so that the bumps 20 are at the bottom and the thick diamond layer 12 is at the top. Each bump 20 is located on a respective contact pad (to shown) on the package substrate. The electronic assembly 28 is subsequently located in a furnace which melts the bumps 20, and is then cooled so that the bumps 20 are attached to the contact pads on the package substrate 30.

In use, electronic signals can be provided through metal lines and vias in the package substrate 32 and from the bumps 20. The electronic signals transmit through the bumps 20 to and from the integrated circuit 16A. Operation of the integrated circuit 16A causes heating thereof. Heating of the integrated circuit 16A is not uniform from one point thereof to another. Hot spots are thus created at various locations across the integrated circuit 16A.

The heat conducts from the integrated circuit 16A through the epitaxial silicon layer 14 and the monocrystalline silicon wafer 10 to the thick diamond layer 12. Heat conducts easily to the thick diamond layer 12 because the monocrystalline silicon wafer 10 is relatively thin. Because of the relatively high thermal conductivity of the thick diamond layer 12, the heat from the hot spots conduct horizontally to cooler areas of the thick diamond layer 12. The temperatures at the hot spots thus can be reduced. More heat can conduct horizontally through the thick diamond layer 12 than compared to a thin diamond layer.

Utilizing a Shearing Operation in the Production of a Thick Diamond Layer

FIG. 2a illustrates a sacrificial polysilicon wafer 50 on which a thick diamond layer 52 is deposited, followed by a polysilicon layer 54. Processes for manufacturing polysilicon wafers are known. A polysilicon ingot is typically manufactured in a casting operation and wafers are then sawed from the ingot. The thick diamond layer 52 is deposited according to the same high-temperature technique discussed with reference to FIG. 1a and also has a thickness of between 300 and 500 microns. The polysilicon layer 54 is deposited utilizing known techniques and has a thickness of between 10 and 15 microns.

As shown in FIG. 2b, the combination wafer is then flipped so that the polysilicon layer 54 is at the bottom.

FIG. 2c illustrates a monocrystalline wafer 56 of the kind described with reference to FIG. 1a. The monocrystalline wafer 56 also has a diameter of approximately 300 mm and a thickness of approximately 750 microns. Hydrogen ions 58 are implanted into an upper surface of the monocrystalline wafer 56.

FIG. 2d illustrates the monocrystalline silicon wafer 56 of FIG. 2c after implantation of the ions 58. The ions 58 create a boundary 60 at a location about 10 to 25 microns below an upper surface of the monocrystalline silicon wafer 56 of FIG. 2c. For further discussion, the portion below the boundary 60 is referred to as the "monocrystalline silicon wafer 56A" and the region above the boundary is referred to as the "final monocrystalline silicon film 56B". Voids are formed at the boundary 60. The voids weaken attachment of the final monocrystalline silicon form 56B to the monocrystalline silicon wafer 56A.

As shown in FIG. 2e, the polysilicon layer 56 is located on the final monocrystalline silicon film 56B and bonded thereto utilizing known silicon bond. The boundary 60 is never exposed to the high CVDD temperatures used for forming the thick diamond layer 52 which could destroy the boundary 60.

Figure 2F:
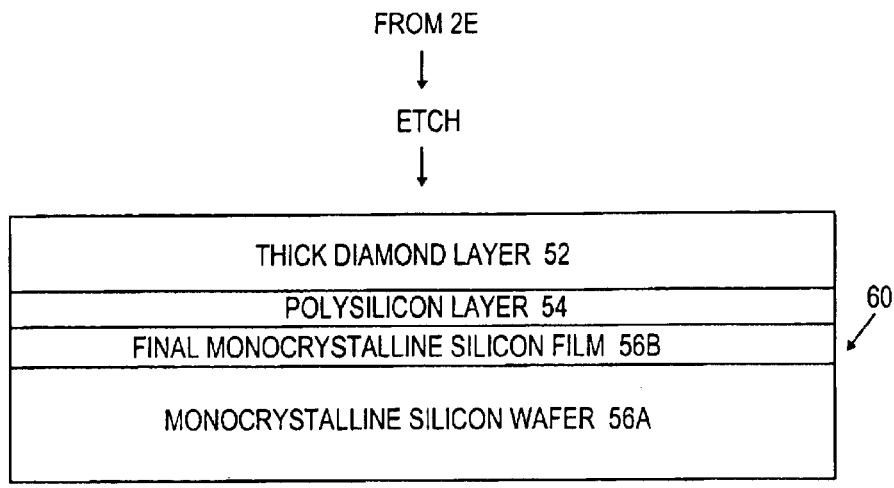
FIG. 2f is a view similar to FIG. 2e after removal of the sacrificial polysilicon wafer.

As shown in FIG. 2f, the sacrificial polysilicon wafer 50 is removed in an etching operation. There is no need for tight control over the etching operation because the thick diamond layer 52 acts as an etch stop. The sacrificial polysilicon wafer 50 can thus be removed relatively fast.

Figure 2G:
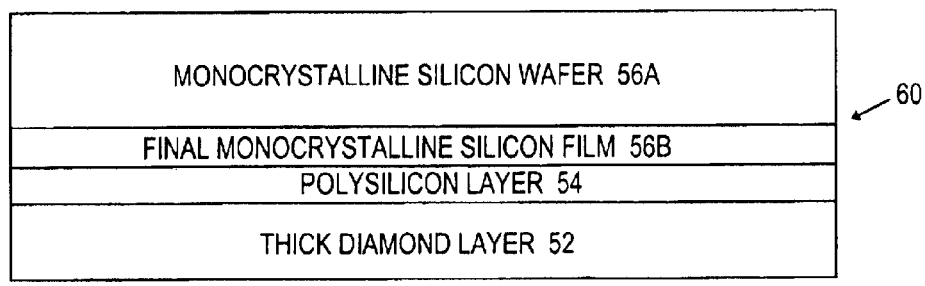
FIG. 2g is a view similar to FIG. 2f with the monocrystalline silicon wafer at the top.

In FIG. 2g, the combination wafer of FIG. 2f is then flipped so that the monocrystalline silicon wafer 56A is at the top.

Figure 2H:
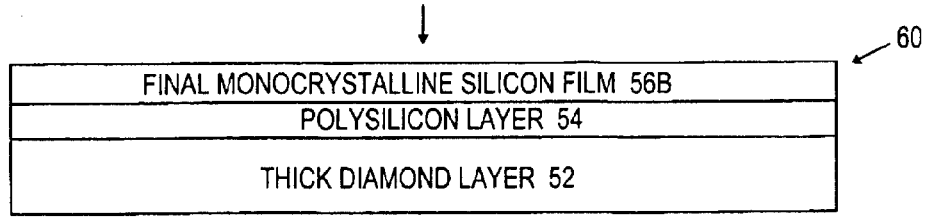
FIG. 2h is a view similar to FIG. 2g after a shearing operation.

As shown in FIG. 2h, the monocrystalline silicon wafer 56A is removed from the final monocrystalline silicon film 56B in a shearing operation. The shearing operation may for example involve a jet of gas which impinges on the monocrystalline silicon wafer 56A. Because of the voids, the monocrystalline silicon wafer 56A shears from the final monocrystalline silicon film 56B at the boundary 60, thus leaving only the final monocrystalline silicon film 56B on the polysilicon layer 54. The final monocrystalline silicon film 56B is then etched and polished and subsequent processing in carried out as hereinbefore described with reference to FIGS. 1d–g.

The process described with reference to FIGS. 2a–h differs from the process described with reference to FIGS. 1a–g because the grinding operation to obtain the combined wafer of FIG. 1c is eliminated. A much faster shearing operation is utilized to obtain the combination wafer of FIG. 2h.

As shown in FIG. 2h, a thick diamond layer 52 is produced. The thick diamond layer 52 has the same advantages and disadvantages as the thick diamond layer 12 of FIG. 1c.

Utilizing a Shearing Operation in the Production of a Thin Diamond Layer

In FIG. 3a, a sacrificial polysilicon wafer 70 is provided in which a thin diamond layer 72 is deposited followed by a polysilicon layer 74. The thin diamond layer 72 is between 50 and 150 microns thick and is deposited utilizing the same CVDD technology hereinbefore described. In FIG. 3b, the combination wafer of FIG. 3a is flipped so that the polysilicon layer 74 is at the bottom. In FIG. 3c, a monocrystalline silicon wafer 80 is implanted with ions 82. As shown in FIG. 3d, the ions create a boundary 84 between a lower monocrystalline silicon wafer 56A and then upper final monocrystalline silicon film 56B. In FIG. 3e the polysilicon layer 74 is bonded to the final monocrystalline silicon film 56B. The similarities between FIGS. 3a–3e with FIGS. 2a–2e are evident. In FIG. 3f, the combination wafer of FIG. 3e is flipped so that the monocrystalline silicon wafer 56A is at the top. As shown in FIG. 3g, the monocrystalline silicon wafer 56A is then sheared from the final monocrystalline silicon film 56B. The shearing is similar to the shearing described with reference to FIG. 2h. An upper surface of the final monocrystalline silicon film 56B is then etched and polished.

As shown in FIG. 3h, further processing is then carried out to form integrated circuits 80A and 80B followed by the formation of solder bump contacts 82. The sacrificial polysilicon wafer 70 provides the structural support for all the layers and components formed thereon. The thin diamond layer 72 is generally not thick enough to support the layers thereon without the sacrificial polysilicon layer 70. The sacrificial polysilicon layer 70 provides a lower silicon surface which is similar to conventional silicon wafers. Conventional tools and equipment which are designed to process conventional silicon wafers can be used to also process the combined wafer of FIGS. 3g and 3h.

A conventional saw is then used to saw through a scribe street 90 between the integrated circuits 80A and 80B. The saw cuts through the final monocrystalline silicon film 56B, the polysilicon layer 74, the thin diamond layer 72, and the sacrificial polysilicon wafer 70. A conventional saw blade can be used for cutting through the thin diamond layer 72 because it is merely between 50 and 150 microns thick.

Figure 3I:
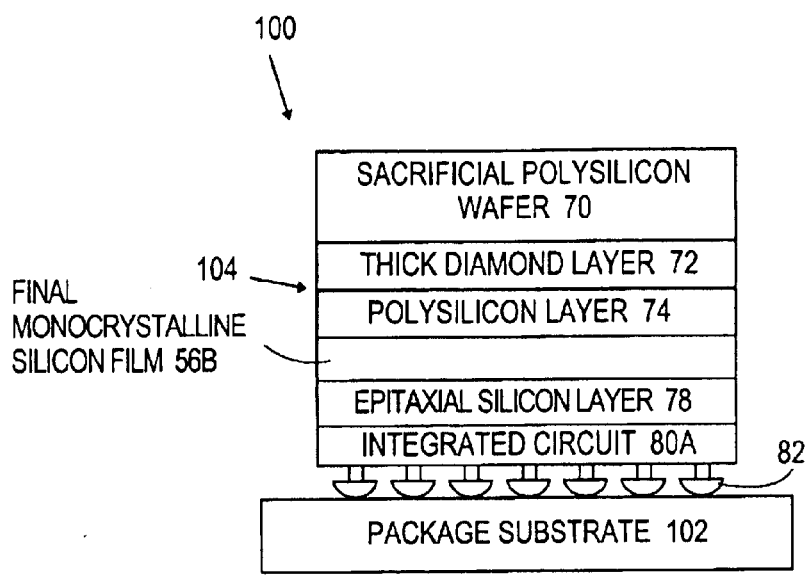
FIG. 3i is a cross-sectional side view of an electronic assembly including a die which is severed from the structure of FIG. 3h and a package substrate with contents of the die located on the package substrate.

FIG. 3i illustrates an electronic assembly 100 including a package substrate 102 and one die 104 on the package substrate 102. The die 104 includes respective portions of the sacrificial polysilicon wafer 70, the thin diamond layer 72, the polysilicon layer 74, the final monocrystalline silicon film 56B and the epitaxial silicon layer 78. The die 74 also includes the integrated circuit 80A, and some of the bumps 82. The bumps 82 are located on contacts on the package substrate 102.

The assembly 100 is then locating in a furnace so that the bumps 82 are melted, and then removed from the furnace so that the bumps 82 solidify and attach to the contact pads on the package substrate 102 thereby securing die 104 to the package substrate 102.

Figure 3J:
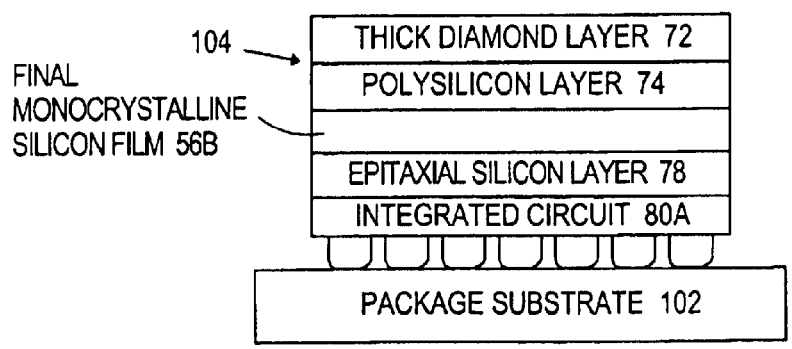
FIG. 3j is a view similar to FIG. 3i after the contacts are attached to the package substrate and the sacrificial polysilicon wafer is removed.

The package substrate 102 is sufficiently thick and strong to support the die 104 without the sacrificial polysilicon wafer 70. As shown in FIG. 3j, the sacrificial polysilicon wafer 70 may then be removed for example in an etching operation. Without removal of the polysilicon wafer 70, the thin diamond layer may still be able to transfer heat from hot spots of the integrated circuit 80A. However, heat is more easily removed from an upper surface of the thin diamond layer 72 if the sacrificial polysilicon wafer 70 is removed. After removal of the sacrificial polysilicon wafer 70, the relatively thin die 104 is structurally supported by the package substrate 102.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of making a plurality of dice, comprising:

forming a first combination wafer having a support layer and a layer of solid diamond on the support layer;

forming a second combination wafer by implanting ions into a surface of a monocrystalline semiconductor material;

forming a third combination wafer by attaching the first combination wafer to the second combination wafer;

shearing a portion of the monocrystalline wafer not implanted with the ions from a portion of the monocrystalline semiconductor material implanted with the ions, the portion of the monocrystalline semiconductor material implanted with the ions forming a layer of monocrystalline semiconductor material on the layer of solid diamond;

manufacturing a plurality of integrated circuits on the layer of monocrystalline semiconductor material; and severing the layer of solid diamond between the integrated circuits.

2. The method of claim 1, further comprising:

forming a support layer with the layer of solid diamond between the support layer and the layer of monocrystalline semiconductor material; and severing the support layer so that respective portions thereof form part of respective ones of the dice.

3. A method of making a plurality of dice, comprising:

forming a layer of solid diamond on a sacrificial wafer;

forming a layer of material on the layer of solid diamond;

implanting ions into a monocrystalline semiconductor material;

bonding a side of the monocrystalline semiconductor material through which the ions are implanted to the layer of material;

severing a portion of the monocrystalline semiconductor material from a final portion thereof that is bonded to the layer of material;

forming an epitaxial layer of semiconductor material on the monocrystalline semiconductor material;

forming a plurality of integrated circuits in and on the epitaxial layer, to form a combination wafer; and severing the combination wafer between the integrated circuits to singulate dice of the combination wafer from one another.

4. The method of claim 3, further comprising:

removing the layer of solid diamond from at least a portion of the sacrificial wafer.

5. The method of claim 4, wherein the layer of solid diamond is removed from the sacrificial wafer before the combination wafer is severed to singulate the dice.

6. The method of claim 3, wherein the layer of solid diamond remains on the sacrificial wafer at least until the portion of the monocrystalline semiconductor material is severed from the final portion thereof.

* * * * *